United States Patent

Tsubouchi et al.

[11] Patent Number: 5,766,682
[45] Date of Patent: Jun. 16, 1998

[54] PROCESS FOR CHEMICAL VAPOR DEPOSITION OF A LIQUID RAW MATERIAL

[76] Inventors: Kazuo Tsubouchi, 30-38, Hitokita 2-chome, Taihaku-ku; Kazuya Masu, 3-3-201, Mikamine 1-chome, Taihaku-ku, both of Sendai-shi, Miyagi-ken, Japan

[21] Appl. No.: 401,993

[22] Filed: Mar. 10, 1995

Related U.S. Application Data

[62] Division of Ser. No. 995,040, Dec. 22, 1992, Pat. No. 5,421,895.

[30] Foreign Application Priority Data

Dec. 26, 1991 [JP] Japan ................... 3-344869

[51] Int. Cl.[6] .................................................. C23C 16/00
[52] U.S. Cl. ................ 427/248.1; 427/250; 427/255.1; 427/255.2
[58] Field of Search ................ 427/255.1, 255.2, 427/255.3, 250, 248.1; 118/715, 726; 117/104

[56] References Cited

U.S. PATENT DOCUMENTS

| | | | |
|---|---|---|---|
| 4,171,235 | 10/1979 | Fraas et al. | 117/104 |
| 4,980,204 | 12/1990 | Fujii et al. | 427/255.1 |
| 5,098,741 | 3/1992 | Nolet et al. | 427/248.1 |
| 5,190,592 | 3/1993 | Chazee | 118/719 |
| 5,204,314 | 4/1993 | Kirlin et al. | 427/255.3 |

FOREIGN PATENT DOCUMENTS

| | | | |
|---|---|---|---|
| 60-89575 | 5/1985 | Japan | 427/572 |
| 64-12521 | 1/1989 | Japan | 118/715 |
| 1-222438 | 9/1989 | Japan | 118/715 |
| 2-91924 | 3/1990 | Japan | 118/726 |

*Primary Examiner*—Roy V. King
*Attorney, Agent, or Firm*—Fitzpatrick, Cella, Harper & Scinto

[57] ABSTRACT

A chemical vapor deposition process is disclosed comprising the steps of forming liquid droplets of a liquid raw material; injecting the liquid droplets through a plate member opening placed opposite to the surface of the substrate to vaporize the liquid droplets; and supplying a reaction gas that reacts with the vaporized raw material; and depositing a thin film on the substrate.

14 Claims, 3 Drawing Sheets

PROCESS FOR CHEMICAL VAPOR DEPOSITION OF A LIQUID RAW MATERIAL

This application is a division of application Ser. No. 07/995,040 filed Dec. 22, 1992, now U.S. Pat. No. 5,421,895.

BACKGROUND OF THE INVENTION

1. Field of the Invention

The present invention relates to an apparatus for vaporizing a liquid raw material, and more particularly to the apparatus applicable preferably for depositing a thin film by chemical vapor deposition.

2. Related Background Art

In a step of forming a thin film in the process for producing an integrated circuit with semiconductors, it is necessary to form a desired thin film on an etched wafer surface of uneven surface level while attaining a good step coverage. In a process for producing an integrated circuit of submicron level, whose minimum processing dimension is not more than 1 μm, or of further deep submicron level, it is necessary to deposit a thin film selectively in contact holes or through holes. It is a step of forming a wiring metal film that requires the keenest selective growth in the process for producing an integrated circuit.

A thin film has been so far formed conventionally by sputtering. Sputtering is a process which deposits atoms sputtered from a target substance onto a substrate. Thus not only is its step coverage poor, but it is also impossible to attain selective growth. On the other hand, chemical vapor deposition, which vaporizes a raw material, transports the vaporized raw material into a reaction space and deposits a desired thin film through chemical reactions of the raw material molecules on the substrate surface, provides distinguished step coverage and can provide selective growth. For example, an Al thin film growth process disclosed in Applied Physics Letters, Vol. 57, No. 12 (1990), Page 1221, can deposit monocrystalline Al selectively in very fine through-holes and also can change the growth mode from a selected mode to a non-selected mode to completely flatten through-holes.

In the chemical vapor deposition process (CVD), it is necessary to vaporize a raw material and transport the vaporized raw material into a reaction space. If the raw material exists in a gaseous state in the CVD, its transportation into the reaction space can be carried out with ease. For example, $SiH_4$ is a gas at room temperature and thus can be filled in a high pressure gas cylinder. Therefore, it can be transported into the reaction space at a desired rate by providing the high pressure gas cylinder with a pressure control valve and a flow meter. However, when a raw material is a liquid at room temperature, its transportation procedure is different from that for $SiH_4$. For example, dimethylaluminum, which is a liquid at room temperature, is used as a raw material in the Al, thin film growth. Such procedure is disclosed in detail in U.S. patent application Ser. No. 578,672, now U.S. Pat. No. 5,179,042 titled "Process for forming deposited film by use of alkyl aluminium hydride", filed Sep. 7, 1990 by the present inventors; U.S. patent application Ser. No. 587,045, now U.S. Pat. No. 5,180,687 titled "Deposited film formation method utilizing selective deposition by use of alkyl aluminum hydride", filed Sep. 24, 1990 by the present inventors, and U.S. patent application Ser. No. 586,877 titled "Gas feeding device and deposition film forming apparatus employing the same" filed Sep. 24, 1990, now U.S. Pat. No. 5,476,547 by the present inventors.

FIG. 3 shows a procedure for transporting a liquid raw material which is widely utilized, where a liquid raw material 2 is stored in a vessel 1 provided with an inlet pipe 103 and an outlet pipe 104, and the inlet pipe 103 is dipped into the liquid raw material 2. When a flow rate-controlled gas 105 is introduced from the inlet pipe 103, the gas 106 is discharged from the outlet pipe 104 through the liquid raw material 2. Since the gas 105 is passed through the liquid raw material 2, the gas 106 can be saturated with the vapor of the liquid raw material 2 and led to a reaction chamber of an apparatus for chemical vapor deposition. The amount of the transported raw material according to the foregoing procedure can be represented approximately by the following equation:

$$Q = Q_{in} \times \frac{P_V}{P_B} \qquad (1)$$

wherein

Q: Amount of transported raw material $Q_{in}$: Amount of gas introduced from the inlet pipe $P_V$: Saturated vapor pressure of raw material gas $P_B$: Pressure inside the vessel When the liquid raw material has a low saturation vapor pressure, the amount of transported raw material is small, as is seen from the equation (1), and in the worst case, the rate of deposition is governed by the amount of the transported raw material. When the pressure $P_B$ inside the vessel is constant, it is possible to introduce dilution gas into the reaction chamber to lower a proportion of the raw material partial pressure in the reaction chamber, but it is impossible to elevate the proportion. In order to enhance the transportation efficiency of the raw material, it is possible to elevate the temperature of the vessel to increase the saturated vapor pressure of the raw material, but the entire vessel and pipes must be heated. When the inlet gas flow rate is increased in the procedure as shown in FIG. 3, the vaporization rate of the liquid raw material cannot meet the inlet gas flow rate, and thus a sufficient amount of the raw material cannot be transported.

In the procedure as shown in FIG. 3, the amount of the gas 105 introduced into the inlet pipe 103 can be exactly determined, but the amount of the raw material discharged from the outlet pipe 106 can be only calculated from the equation (1), and its actual amount cannot be detected, that is, the exact amount of transported raw material can not be determined.

In the above-mentioned Al CVD using dimethylaluminum hydride (DMAH), deposition of high quality Al film can be conducted, but the saturated vapor pressure of DMAH at room temperature is as low as 2 Torr and there thus remains the problem that a large amount of DMAH can not be efficiently transported and no higher deposition rate can be attained.

As mentioned above, it is necessary in chemical vapor deposition using a liquid raw material in the technical field of semiconductor integrated circuits of higher speed and higher degree of integration due to the recent trends for miniaturization to transport a large amount of raw material stably and exactly. Accordingly there still remain unsolved problems for the mass production.

SUMMARY OF THE INVENTION

An object of the present invention is to provide a means of efficiently vaporizing even a raw material having a low saturated vapor pressure at room temperature efficiently and transporting a large amount of the vaporized raw material exactly and also to provide an apparatus capable of transporting a large amount of raw material stably and exactly in CVD using a liquid raw material.

According to one aspect of the present invention, there is provided an apparatus for vaporizing a liquid raw material, which comprises a nozzle with an open tip end for ejecting a liquid raw material into a heated gas atmosphere as liquid droplets and a heated plate with a small opening disposed in front of the nozzle, a space opposite to that occupied by the nozzle with respect to the plate being evacuated.

According to another aspect of the present invention, there is provided an apparatus for forming a thin film, which comprises the above-mentioned apparatus for vaporizing a liquid raw material, where a large number of substrates can be treated stably.

In the transportation of a large amount of a liquid raw material, it is necessary to vaporize a liquid raw material efficiently in a high temperature circumstance for elevating the saturated vapor pressure. In a bubbling system as shown in FIG. 3, a sufficiently large amount of a liquid raw material is not vaporized even by heating the vessel 1 appropriately, and it is thus quite difficult to transport a large amount of the raw material.

In the present invention, on the other hand, a nozzle for ejecting a liquid raw material in a liquid droplet state into a gas heated to a temperature lower than the decomposition temperature of the liquid raw material is provided, where the liquid raw material can be ejected as liquid droplets having a diameter of 10 to 50 μm into the heated atmosphere gas to be vaporized efficiently.

DESCRIPTION OF THE PREFERRED EMBODIMENTS

Figure 1:
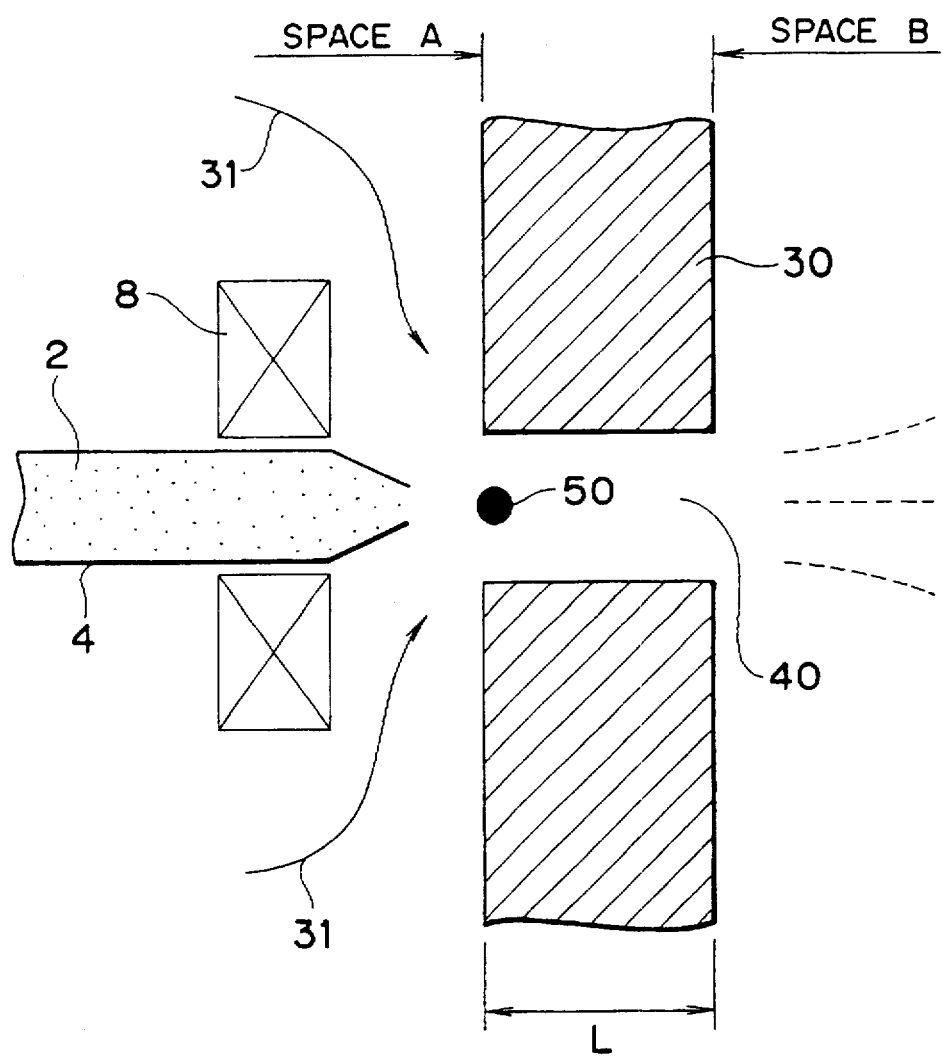
FIG. 1 is a schematic cross-sectional view of the main part of an apparatus for vaporizing a liquid raw material according to the present invention.

Preferable embodiments of the present invention will be explained in detail below, referring to the drawings.

According to the present invention, a liquid raw material is transported in a liquid state and ejected into a heated gas in a reaction chamber, thereby completely incorporating a vapor of the liquid raw material having its saturated vapor pressure into the heated gas.

FIG. 1 schematically shows the region for ejecting a liquid raw material and the region for vaporizing the ejected liquid raw material, where a nozzle 4 has a tip end with a reduced cross sectional area, through which a liquid raw material 2 is transported at a controlled flow rate, and a piezoelectric vibrator 8 gives vibrations to the tip end of nozzle 4. When the liquid raw material 2 is led to the nozzle tip end in this structure while vibrating to the nozzle tip end, the liquid raw material 2 is ejected in liquid droplets having a diameter of about 10 μm to about 50 μm from the nozzle tip end due to the nozzle vibrations.

A plate 30 having a small opening 40 is provided in front of and in the direction of the nozzle tip end. A heater (not shown in the drawing) is embedded in the plate 30 to heat the plate 30. An inert gas or $H_2$ gas or their mixed gas 31 flows into the opening 40 from the nozzle surrounding.

At that time, space A is under a pressure of 500 to 760 Torr, whereas space B, which is a reaction chamber, is under a pressure for depositing a thin film, for example, 0.1 to 10 Torr. A pressure gradient develops in the opening 40 from the space A towards the space B. The space B is evacuated by an evacuating means (not shown in the drawing) and kept under the predetermined pressure. The pressures of spaces A and B are not limited to the above-mentioned values. In principle, as long as the pressure of space A is higher than that of space B, any values are available. That is, the space A can be in a pressurized state of 1 to 2 $kg/cm^2$. When a liquid droplet 50 is ejected from the nozzle 4 into the space A, small opening 40 and space B, the liquid droplet 50 is vaporized in the small opening 40 and introduced as a gas into the space B.

Figure 3:
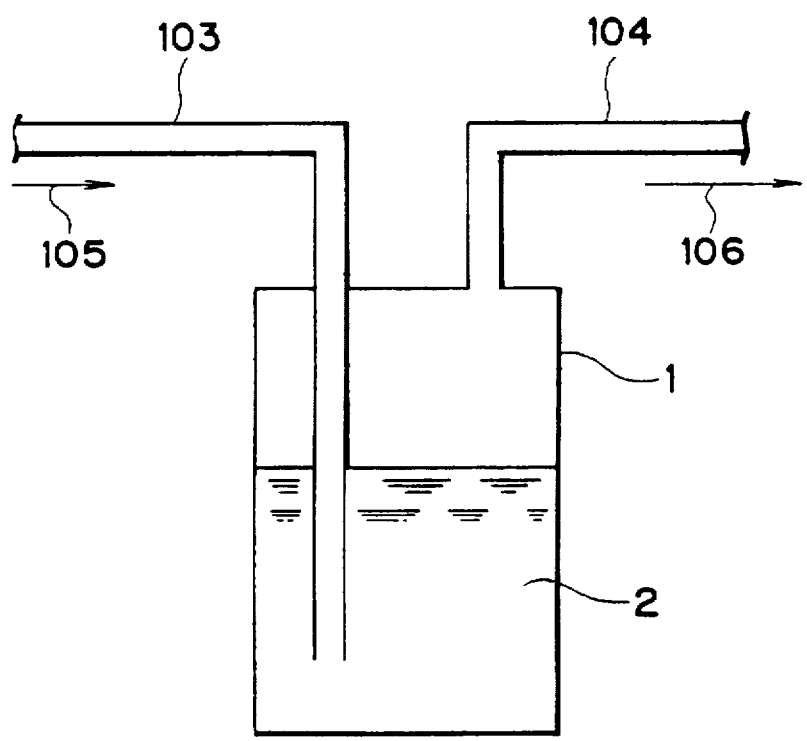
FIG. 3 is a cross-sectional view of a conventional liquid raw material bubbler.

When the small opening 40 is at room temperature, the liquid droplet 50 will not be vaporized, but the plate 30 is heated and the heated gas 31 is introduced, and thus the liquid droplet ejected from the nozzle can be vaporized in the small opening. Different from the conventional procedure of heating the entire vessel and the entire pipes to increase the amount of transported liquid raw material, as shown in FIG. 3, the present vaporizing structure, as shown in FIG. 1, can exactly determine the amount of liquid raw material as transported and can increase the amount of liquid raw material up to the corresponding saturated vapor pressure at an elevated temperature.

Figure 2:
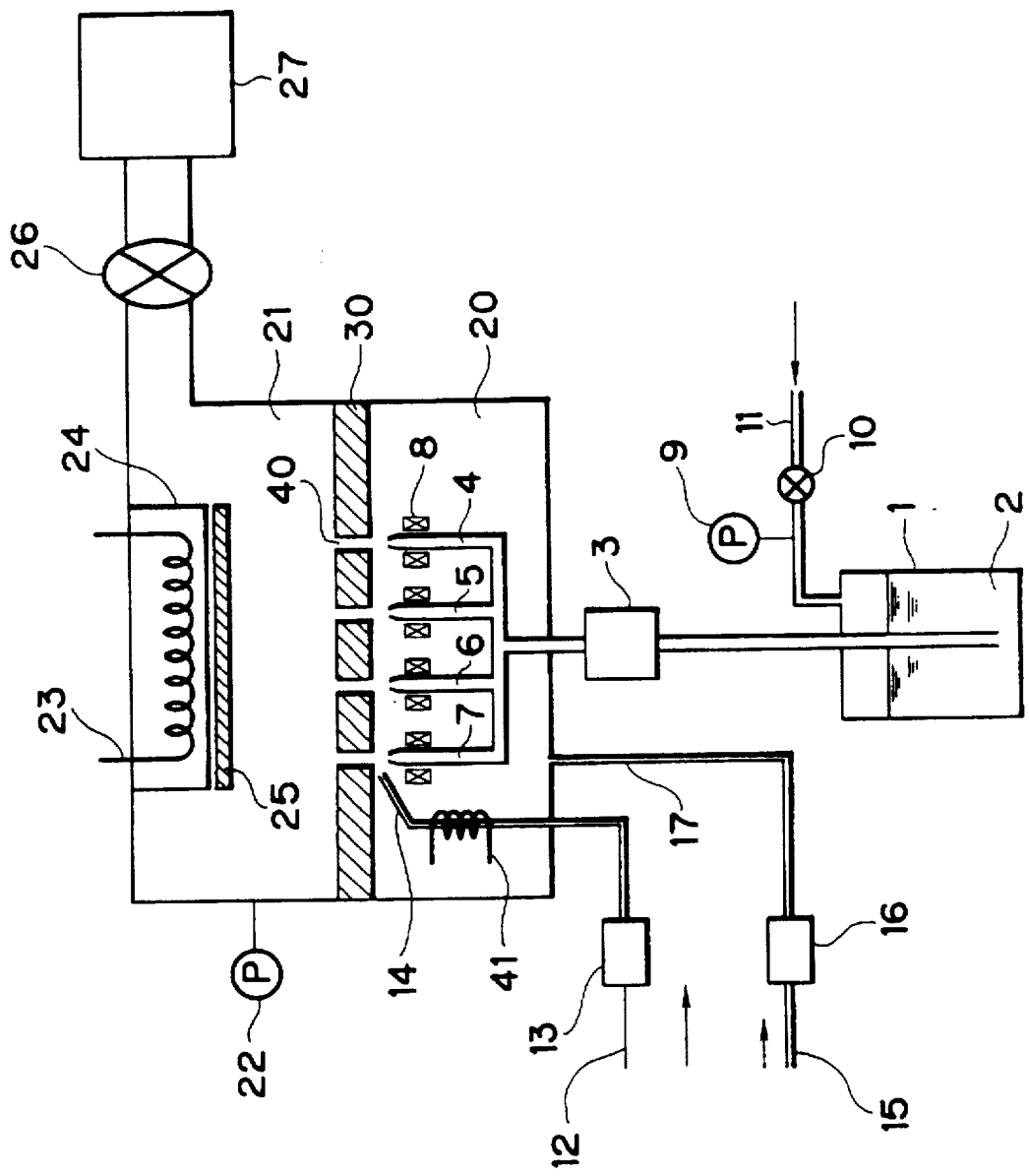
FIG. 2 is a schematic cross-sectional view of an apparatus for depositing a thin film, to which the present apparatus for vaporizing a liquid raw material is applied.

FIG. 2 schematically shows one embodiment of an apparatus for chemical vapor deposition, provided with the apparatus for vaporizing a liquid raw material, shown in FIG. 1, where a vessel 1 containing a liquid raw material 2 is pressurized with a pressurizing gas from a gas inlet 11 through a valve 10 and the applied pressure is adjusted with a pressure gage 9. As the pressurizing gas, any gas may be used so long as it is unreactable with the liquid raw material 2. For example, when the liquid raw material is an organometallic compound, an inert gas such as Ar, $N_2$, He, Ne, etc. can be used. When trimethylaluminum, dimethylaluminum hydride, trimethylgallium or the like is used as a liquid raw material, these organometals decompose in the presence of a hydrogen gas even at room temperature, and thus Ar, $N_2$, He, Ne or the like is preferable. From the viewpoint of low cost and high purity, Ar or $N_2$ is more preferable.

When the vessel 1 is pressurized by the pressurizing gas from the gas inlet 11, the liquid raw material 2 is led to a liquid flow rate meter 3 on the basis of the principle of siphon. A commercially available liquid mass flow controller can be used as the liquid flow rate meter. Any flow rate meter can be used, so long as it can exactly determine the flow rate of the liquid raw material. After the passage through the liquid flow rate meter 3, the liquid raw material is led to nozzles 4 to 7.

In FIG. 2, only four nozzles are shown, but less or more than four nozzles can be used. In FIG. 2, the nozzles are shown as if they are disposed in a straight line, but disposition of nozzles in a concentric state in a plane is desirable. Each of the nozzles 4 to 7 is provided with a piezoelectric vibrator 8, and liquid droplets are ejected from the individual nozzle tip ends.

In the embodiments shown in FIGS. 1 and 2, the liquid raw material is ejected into a liquid droplet state from the individual nozzle tip ends by vibrations of the piezoelectric vibrators. Any other means than the piezoelectric vibrators can be used, if they can eject liquid droplets having a diameter of 10 to 100 μm. Space 20 is set to approximately the atmospheric pressure, whereas space 21 is set to an appropriate pressure of 0.1 to 10 Torr for formation of a desired deposited film. Pressure difference between the space 20 and the space 21 is created by small openings 40 provided through a baffle plate 30. The small openings 40 of the baffle plate 30 are each disposed in front of the nozzle tip ends. The number of the small openings 40 can be equal to or more than the number of the nozzles. Disposition of the small openings to the individual nozzle tip ends is as in FIG. 1. Near each of the small openings and each of the nozzle tip ends, gas ejection outlets 14 are provided.

FIG. 2 shows as if only one gas ejection outlet 14 is provided for only the tip end of nozzle 7, but actually gas ejection outlets 14 are provided for the individual nozzles 4 to 7. The gas from the gas ejection outlets 14 is heated in advance by heaters 41. The temperature of nozzles 4 to 7 is set to a temperature at which the liquid raw material may not be decomposed. Numeral 12 is a gas inlet and 13 is a gas flow rate meter. A gas may be introduced into the space 20 through a pipe 17 via a flow rate meter 16 from a piping inlet. As explained referring to FIG. 1, the baffle plate 30 is heated by a heater (not shown in the drawing), and the liquid droplets ejected from the nozzles 4 to 7 are vaporized in the small openings 40 provided through the baffle plate 30.

The baffle plate 30 may be of a metal or of an insulating material. In case of an organometal as a liquid raw material, decomposition reaction of the organometal is promoted on a heated metal, and thus an insulating material such as quartz or BN (boron nitride) is preferable. Furthermore, from the viewpoint of excellent processability and easy embedment of a heater for heating, BN (boron nitride) is more preferable for the baffle plate 30. The baffle plate 30 needs to have a thickness such that the liquid droplets ejected from the nozzles 4 to 7 can be fully vaporized in the heated spaces of the individual small openings 40. In the embodiment shown in FIG. 2, the thickness is about 5 mm to about 3 cm. Basically the size of the individual small openings 40 need to be larger than the diameter of the liquid droplet, and is about 0.5 to about 2 mm in diameter. In the reaction chamber 21, a substrate 25 is placed on a substrate support 24. In the embodiment shown in FIG. 2, the substrate 25 is heated by a heater from the back side of the substrate 25. The substrate 25 can be heated by high frequency heating or by lamp heating. The reaction chamber 21 is connected to an evacuating valve 26 and to evacuating means 27. To adjust the reaction chamber 21 to a desired pressure, the degree of opening of the valve 26 is controlled while observing the pressure gage 22.

The apparatus for vaporizing a liquid raw material shown in FIG. 1 as one embodiment of the present invention and the apparatus for depositing a thin film shown in FIG. 2 as one embodiment of the present invention can be utilized in all the apparatuses for chemical vapor deposition using a liquid raw material. For example, organometallic raw materials such as trimethylaluminum, dimethylaluminum hydride, triisobutylaluminum hydride, trimethylgallium, etc. as a liquid raw material or tetraethylsilane can be used as a raw material. Particularly, the present invention is effective for dimethylaluminum hydride (vapor pressure at room temperature: about 1 to about 2 Torr) and triisobutylaluminum (vapor pressure at room temperature: about 0.1 Torr) having a low vapor pressure at room temperature. Furthermore, a plurality of gases can be used as raw material gas. For example, when a GaAs thin film is formed, trimethylgallium is ejected from the nozzles, and $AsH_3$ is introduced into the reaction chamber 21. In the apparatus for depositing a thin film as shown in FIG. 2, only one kind of the liquid raw material is given, but a GaAlAs liquid crystal thin film can be also deposited with trimethylgallium from one vessel and trimethylaluminium from another vessel.

An embodiment of depositing a thin film in the apparatuses as shown in FIGS. 1 and 2 will be described in detail below, where dimethylaluminium hydride was used as a liquid raw material, an inert gas Ar was used as a pressurizing gas from the gas inlet 11, and nozzles 4 to 7 made of stainless steel were used. Liquid droplets having a diameter of 10 to 50 μm were ejected from the nozzles 4 to 7 with the vibrators 8 at a frequency of 1 to 50 kHz. $H_2$ gas was used as the gas from the gas inlets 14 and adjusted to an inlet gas temperature of about 150° C. at the ejection outlets 14. The inlet gas temperature was preferably lower than the decomposition temperature of dimethylaluminum hydride, 160° C. $H_2$ gas was likewise introduced from the gas inlet 12. A BN plate embedded with a heater was used as the baffle plate 30, and the reaction chamber 21 was adjusted to a pressure of 0.1 to 3 Torr, whereas the space 20 was under a pressure of the atmospheric pressure to 500 Torr. Under these conditions, the liquid droplets ejected from the nozzles 4 to 7 were vaporized in the small openings 40, and a large amount of dimethylaluminum hydride could therefore be introduced into the reaction chamber 21 to deposit a thin Al film. When the substrate temperature was at about 270° C., an Al film of excellent film quality and surface flatness could be deposited.

When dimethylaluminum hydride was bubbled at a flow rate of 100 SCCM or more under a vessel inside pressure of the atmospheric pressure at room temperature according to the conventional system shown in FIG. 3, the amount of the transported raw material was not proportional to the bubbling flow rate due to the high viscosity and was therefore saturated. On the other hand, in the apparatuses of the present invention, as shown in FIGS. 1 and 2, the dimethylaluminum hydride could be transported proportionally to the transported amount of the liquid, and a high speed deposition of 1 μm/min. could be attained on a 4-inch wafer.

As explained above, a liquid raw material having even a low vapor pressure can be ejected into a high temperature atmosphere as liquid droplets and a large amount of the raw material can therefore be transported in the present invention.

What is claimed is:

1. A chemical vapor deposition process comprising the steps of:

arranging a substrate in a first chamber that is separated from an adjacent second chamber by a baffle plate having a plurality of openings provided therethrough;

making the pressure of the second chamber higher than that of the first chamber;

supplying a liquid raw material to plurality of nozzles provided in the second chamber through a flow rate meter;

heating the substrate;

injecting liquid droplets of the raw material from the plurality of nozzles toward the plurality of openings;

heating the baffle plate; and effecting deposition of a thin film on the substrate.

2. The process according to claim 1, wherein the raw material comprises alkyaluminium hydride.

3. The process according to claim 1, wherein the raw material comprises dimethylaluminium hydride.

4. The process according to claim 1, wherein the raw material comprises any one of trimethylaluminium, trimethylgallium and tetraethylsilane.

5. The process according to claim 1, further comprising a step of introducing heated hydrogen gas into the second chamber.

6. The process according to claim 2, further comprising a step of introducing heated hydrogen gas into the second chamber.

7. The process according to claim 3, further comprising a step of introducing heated hydrogen gas into the second chamber.

8. A chemical vapor deposition process comprising the steps of:

arranging a substrate in a first chamber that is separated form an adjacent second chamber by a plate having a plurality of openings provided therethrough;

making the pressure of the second chamber higher than that of the first chamber;

supplying a liquid raw material to a plurality of nozzles provided in the second chamber through a flow rate meter;

heating the substrate;

injecting liquid droplets of the raw material from the plurality of nozzles toward the plurality of openings;

heating the plate; and effecting deposition of a thin film on the substrate.

9. The process according to claim 8, wherein the raw material comprises alkyaluminium hydride.

10. The process according to claim 8, wherein the raw material comprises dimethylaluminium hydride.

11. The process according to claim 8, wherein the raw material comprises any one of trimethylaluminium, trimethylgallium, and tetraethylsilane.

12. The process according to claim 8, further comprising a step of introducing heated hydrogen gas into the second chamber.

13. The process according to claim 9, further comprising a step of introducing heated hydrogen gas into the second chamber.

14. The process according to claim 10, further comprising a step of introducing heated hydrogen gas into the second chamber.

* * * * *

UNITED STATES PATENT AND TRADEMARK OFFICE
CERTIFICATE OF CORRECTION

PATENT NO. : 5,766,682

DATED : June 16, 1998

INVENTOR(S): KAZUO TSUBOUCHI ET AL.

It is certified that error appears in the above-identified patent and that said Letters Patent is hereby corrected as shown below:

COLUMN 1

Line 55, "Al," should read --Al--;
Line 58, "aluminium" should read --aluminum--.

COLUMN 3

Line 58, "to" should be deleted.

COLUMN 6

Line 2, "trimethylaluminium" should read
  --trimethylaluminum--;
Line 5, "dimethylaluminium" should read
  --dimethylaluminum--;
Line 52, "to" should read --to a--;
Line 62, "alkyaluminium" should read --alkylaluminum--;
Line 64, "dimethylaluminium" should read
  --dimethylaluminum--;
Line 66, "trimethylaluminium" should read
  --trimethylaluminum--.

COLUMN 7

Line 13, "form" should read --from--.

UNITED STATES PATENT AND TRADEMARK OFFICE
CERTIFICATE OF CORRECTION

PATENT NO. : 5,766,682

DATED : June 16, 1998

INVENTOR(S): KAZUO TSUBOUCHI ET AL.

It is certified that error appears in the above-identified patent and that said Letters Patent is hereby corrected as shown below:

COLUMN 8

Line 4, "alkyaluminium"   should read --alkylaluminum--;
Line 6, "dimethylaluminium" should read --dimethylaluminum--;
Line 9, "trimethylaluminium" should read
  --trimethylaluminum--.

Signed and Sealed this

Sixth Day of April, 1999

Attest:

Q. TODD DICKINSON

*Attesting Officer*     *Acting Commissioner of Patents and Trademarks*